(12) United States Patent
Li et al.

(10) Patent No.: US 9,410,083 B2
(45) Date of Patent: Aug. 9, 2016

(54) PHOSPHOR COMPOSITION WITH SELF-ADJUSTING CHROMATICITY

(75) Inventors: Yi-Qun Li, Danville, CA (US); Yi Dong, Tracy, CA (US)

(73) Assignee: Intematix Corporation, Fremont, CA (US)

( * ) Notice: Subject to any disclaimer, the term of this patent is extended or adjusted under 35 U.S.C. 154(b) by 1194 days.

(21) Appl. No.: 12/910,644

(22) Filed: Oct. 22, 2010

(65) Prior Publication Data

US 2011/0037380 A1 Feb. 17, 2011

Related U.S. Application Data

(62) Division of application No. 11/805,808, filed on May 23, 2007, now Pat. No. 7,820,075.

(60) Provisional application No. 60/837,178, filed on Aug. 10, 2006.

(51) Int. Cl.
| | |
|---|---|
| *H01J 63/04* | (2006.01) |
| *C09K 11/77* | (2006.01) |
| *C09K 11/88* | (2006.01) |
| *H01L 33/50* | (2010.01) |

(52) U.S. Cl.
CPC ......... *C09K 11/7734* (2013.01); *C09K 11/7731* (2013.01); *C09K 11/7774* (2013.01); *C09K 11/883* (2013.01); *H01L 33/504* (2013.01)

(58) Field of Classification Search
USPC ...................... 313/46, 498–500, 503; 257/98; 252/301.4 R, 301.4 F, 301.4 S, 301.6 S
See application file for complete search history.

(56) References Cited

U.S. PATENT DOCUMENTS

| | | | |
|---|---|---|---|
| 7,311,858 B2 | 12/2007 | Wang et al. | |
| 7,601,276 B2 | 10/2009 | Li et al. | |
| 7,642,708 B2 * | 1/2010 | Juestel et al. | 313/503 |
| 2004/0104391 A1 * | 6/2004 | Maeda et al. | 257/79 |
| 2004/0135504 A1 | 7/2004 | Tamaki et al. | |
| 2004/0207313 A1 | 10/2004 | Omoto et al. | |
| 2005/0029929 A1 | 2/2005 | Debray | |

(Continued)

FOREIGN PATENT DOCUMENTS

| | | |
|---|---|---|
| JP | 2006-036943 A | 2/2006 |
| WO | WO2005/098972 A1 | 10/2005 |
| WO | WO2007/035026 A1 | 3/2007 |

OTHER PUBLICATIONS

WO03/080763 (US 7642708).*

(Continued)

*Primary Examiner* — Nimeshkumar Patel
*Assistant Examiner* — Jacob R Stern
(74) *Attorney, Agent, or Firm* — David H. Jaffer; Pillsbury Winthrop Shaw Pittman LLP

(57) ABSTRACT

Disclosed herein are "smart" phosphor compositions capable of regulating the chromaticity of their emission to substantially constant values even with variations in the excitation radiation they receive to induce photoluminescence. One phosphor of the smart composition demonstrates an increase in emission intensity increases as the wavelength of the excitation radiation is increased. The other phosphor shows a decrease in emission intensity with increasing excitation wavelength. Constant chromaticity in this context is defined as a change in CIE x or y coordinate of less than about five percent over a 10 nm range of excitation wavelengths.

15 Claims, 11 Drawing Sheets

(56) References Cited

U.S. PATENT DOCUMENTS

| | | |
|---|---|---|
| 2005/0168127 A1 | 8/2005 | Shei et al. |
| 2005/0200271 A1 | 9/2005 | Juestel |
| 2005/0205845 A1 | 9/2005 | Delsing et al. |
| 2005/0224828 A1 | 10/2005 | Oon et al. |
| 2006/0027785 A1 | 2/2006 | Wang et al. |
| 2006/0028122 A1 | 2/2006 | Wang et al. |
| 2006/0145123 A1 | 7/2006 | Li et al. |
| 2007/0029526 A1 | 2/2007 | Cheng et al. |
| 2007/0096131 A1* | 5/2007 | Chandra .................. 257/99 |

OTHER PUBLICATIONS

International Search Report and Search Opinion dated Jun. 24, 2010 for European Application No. EP07835824.9, 7 pages.

International Search Report and Written Opinion dated May 28, 2008 for Application No. PCT/US2007/014305, 10 pages.

Blasse, G., et al., Fluorescence of $Eu^{2+}$-Activated Silicates, 1968, pp. 189-200, Philips Research Reports, vol. 23, No. 1.

\* cited by examiner

SMP: (0.8)$Sr_{1.025}Ba_{0.925}Mg_{0.05}Eu_{0.05}Si_{1.03}O_4(F,Cl)_{0.12}$+(0.2)$Sr_{2.94}Ba_{0.06}Eu_{0.06}Si_{1.02}O_5(F,Cl)_{0.18}$

YELLOW PHOSPHOR: $Sr_{1.5}Ba_{0.45}Mg_{0.05}Eu_{0.06}Si_{1.03}O_4(F,Cl)_{0.12}$

SMP: (0.8)Sr$_{1.025}$Ba$_{0.925}$Mg$_{0.05}$Eu$_{0.06}$Si$_{1.03}$O$_4$(F,Cl)$_{0.12}$+(0.2)Sr$_{2.94}$Ba$_{0.06}$Eu$_{0.06}$Si$_{1.02}$O$_5$(F,Cl)$_{0.18}$

YELLOW PHOSPHOR: Sr$_{1.5}$Ba$_{0.45}$Mg$_{0.05}$Eu$_{0.06}$Si$_{1.03}$O$_4$(F,Cl)$_{0.12}$

|  | EM COLOR | | | EX CURVE (450-460nm) | |
| --- | --- | --- | --- | --- | --- |
|  | GREEN | YELLOW | ORANGE | RED | |
| G-Series | ▓ |  |  |  | ▓ |
| Y-Series |  | ▓ |  |  | ▓ |
| O-Series |  |  | ▓ |  |  |
| YAG |  | ▓ |  |  |  |
| TAG |  | ▓ | ▓ |  |  |
| GP-4 (Green YAG) | ▓ |  |  |  | ▓ |
| SrGa2S4:Eu | ▓ |  |  |  | ▓ |
| CaS:Eu |  |  |  | ▓ |  |
| ZnSe(x)S(1-x):Cu |  |  | ▓ | ▓ |  |
| SrSi2O2N2:Eu |  |  |  |  | ▓ |
| (SrBaCa)2Si5N8:Eu |  |  |  | ▓ | ▓ |
| Sr2Si5N8:EU |  |  |  |  |  |

FIG. 5A

WHICH PAIR CAN BE SMART?

| | G-Series | Y-Series | O-Series | YAG | TAG | GP-4 (Green YAG) | SrGa2S4:Eu | CaS:Eu | ZnSe[x]S[1-x]:Cu | SrSi2O2N2:Eu | (SrBaCa)2Si5 |
|---|---|---|---|---|---|---|---|---|---|---|---|
| G-Series | | | | | | | | | | | |
| Y-Series | | | | | | | | | | | |
| O-Series | | | | | | | | | | | |
| YAG | | | | | | | | | | | |
| TAG | | | | | | | | | | | |
| GP-4 (Green YAG) | | | | | | | | | | | |
| SrGa2S4:Eu | | | | | | | | | | | |
| CaS:Eu | | | | | | | | | | | |
| ZnSe[x]S[1-x]:Cu | | | | | | | | | | | |
| SrSi2O2N2:Eu | | | | | | | | | | | |
| (SrBaCa)2Si5N8:Eu | | | | | | | | | | | |
| Sr2Si5N8:EU | | | | | | | | | | | |

FIG. 5B

PHOSPHOR COMPOSITION WITH SELF-ADJUSTING CHROMATICITY

CROSS-REFERENCE TO RELATED APPLICATION

This application is a divisional of U.S. patent application Ser. No. 11/805,808 filed May 23, 2007, titled Phosphor Composition with Self-Adjusting Chromaticity, By Yi-Qun Li et al., (now U.S. Pat. No. 7,820,075) which application claims the benefit of and priority to U.S. Provisional Patent Application No. 60/837,178, titled "Two-phase yellow phosphor with self-adjusting emission wavelength," filed Aug. 10, 2006, by inventors Yi-Qun Li and Yi Dong. U.S. patent application Ser. No. 11/805,808 and U.S. Provisional Patent Application No. 60/837,178 are hereby incorporated by reference.

BACKGROUND OF THE INVENTION

1. Field of the Invention

Embodiments of the present invention are directed to phosphor compositions in light emitting devices comprising a light emitting diode (LED) or laser diode and an excitable phosphor composition.

2. Description of the Related Art

The advent of GaN-based epitaxial structures has lead to the development of UV and/or blue ("UV/blue") radiation sources in the form of light emitting devices, including light emitting diodes and lasers, both generally referred to herein as "LEDs." In general, the radiation source excites a phosphor or phosphor composition comprising two or more phosphors to generate visible light in the red, green, or blue region of the spectrum. The red, green, and blue light may then be combined to make white light. The phosphor(s) transforms a portion of the UV and/or blue light into light of longer wavelength in a process known as down conversion. For example, a process of making white light whereby yellow light from a phosphor such as $Y_3Al_5O_{12}:Ce^{3+}$ (commonly referred to as YAG-Ce) is combined with the blue light from a blue LED has been disclosed by Nichia Chemical Company.

To form white light, the YAG-Ce phosphor converts a portion of the blue light from the blue LED chip into yellow light, which is combined with blue light from the LED that had not absorbed by the phosphor. This produces a white light with a color rendering index (CRI) of about 77, and a color temperature ranging from about 6,000 to 8,000 K. For some applications, the generation of white light by down conversion of UV/blue light from an LED to longer-wavelength light using phosphors (and then combining light from with blue LED with light emitted by the phosphor) may be a more attractive white light to the user than white light made by combining red, green, and blue light directly from a red, green, and blue LED, respectively. Such UV/blue phosphor devices, for example, enable a more widely available color range, which is important for display as well as for illumination applications. The addition of different phosphors to Nichia's yellow phosphor to convert UV/blue LED light to wavelengths other than yellow is known, and thus, it is known that the overall, combined color of the product light from an LED/phosphor system may be modified by adjusting the individual phosphors in a composition.

A difficulty often encountered when generating white light by these techniques is a variation in the quality of the white light produced as a result of statistical fluctuations that occur during the manufacturing of the blue/UV LEDs. Blue and/or UV emitting LED devices are fabricated by depositing a variety of materials in a layered fashion onto a wafer of semiconductor material. The wafer is processed to until an array of tens, hundreds, or even thousands of LEDs are made. They are then separated by a technique known as dicing to form the individual LED "chips." But manufacturing LED chips in this fashion poses an inherent problem: they cannot all be made perfectly alike, and there is bound to be some variation among the diced LED chips. Such variations may be manifested by color output of the LED, for example, as characterized by spectral power distribution and peak emission wavelength. These quantities may vary due to fluctuations in the bandgap width of the active layer(s) of the LED(s). Another cause of variable blue/UV light output is the fact that, during operation, the power supplied to used to drive the LED may fluctuate as well.

During production, a certain percentage of LEDs are manufactured with active layers whose actual band gap width is either larger, or smaller, than that which is desired. Thus, the color output of such LEDs deviates from the desired parameters. Furthermore, even if the band gap of a particular LED does have the desired width, the power applied to the LED can change during operation. This can also cause the LED color output to depart from desired parameters. Since the light emitted by some systems contains a blue component from the LED, the color output of the LED changes as well. A significant deviation from the desired parameters may cause the color output of the system to appear non-white (i.e., either bluish or yellowish).

Past solutions to this problem have included a "binning" procedure, in which the electroluminescent characteristics of each of the blue/UV LEDs arrayed on a wafer are measured prior to dicing, after which the individual LEDs are categorized (or "sorted") in terms of any of 1) peak emission wavelength of the light emitted by the LED, 2) peak intensity of the light emitted by the LED, and 3) by forward voltage. Binning relies on the fact that LEDs are current devices. This means that the intensity of the light emitted by the LED is regulated by the electrical current supplied to the LED, referred to as the "forward current." Often, a series resistor is placed in the circuit proximal to the voltage source: this resister protects the LED from an excessive current overload. The value of the forward voltage depends on this series resistance, the voltage supplied to the circuit, and the desired forward current through the LED (computed from the desired intensity, since the light output is directly proportional to the forward current).

A typical commercial binning process sorts the LEDs after fabrication by any of forward voltage, peak emission wavelength, and peak emission intensity, depending on the importance of those parameters to the manufacturer. As explained above, the voltage applied to the circuit determines the current that flows through the diode, which in turn affects the intensity of the light emitted from the device. Thus, variations in portions of the circuit supporting the LED, particularly that portion which supplies power, is manifested in the "series resistance" that affects the current delivered to active layer of the LED. As demonstrated schematically in FIG. 1, an imaginary wafer has been diced to separate the individual LED circuits, and sorted according to three forward voltage groupings described generally as VF1, VF2, and VF3.

The band gap width of the LEDs' junction region determines the peak emission wavelength of the emitted light, which in turn affects color output and chromaticity. For any one value of the forward current, a range of peak emission wavelengths (e.g., color output) may be observed. This is illustrated schematically in FIG. 1. For each group of forward voltage values, sorting further proceeds by arranging LEDs into subgroups based on emission wavelength. In FIG. 1, a set of five binned peak emission wavelengths are first grouped according to the value of the forward voltage across the LED; then for each of the three forward voltage bins, LEDs are further categorized by peak emission wavelength. In the example of FIG. 1, the peak wavelength bins are centered at 452.5, 455.0, 457.5, 460.0, and 462.5 nm, respectively. The bins themselves may have the ranges: less than 450 nm, 450 to 425.5 nm, 425.5 to 455 nm, 455 to 457.5 nm, 457.5 to 460 nm, and greater than 460 nm.

Some manufacturing operations may require further refinement in LED sorting. For example, each of those bins described in FIG. 1 (which are 2.5 nm wide) may be divided into an additional five bins according to chromaticity, resulting in a total now of 75 bins. The binning process could go on indefinitely. For example, the 75 bins each having a 2.5 nm width may be further divided into three groups by brightness. In the example of FIG. 1, there are now a total of 225 bins defined for all of the LED chips originally fabricated on the hypothetical wafer.

While desirable in some instances, binning does not have to be predicated on wavelength ranges of the excitation source. In some processes, each LED chip (or "die") is electrically connected to an external circuit via two electrodes, and the diced LED wafer is then tested for forward voltage of the device, or light output power from the illumination system. Exemplary categories for binning by forward voltage into four bins are less than 3 volts, 3.0 to 3.2 volts, 3.2 to 3.4 volts, and 3.4 to 3.6 volts. Alternatively, when binning is based on light output power, such bin categories may be arranged as less than 8 mW, 8 to 10 mW, 10 to 12 mW, and 12 to 14 mW.

The light output of the blue/UV LED determines in part the color output of the illumination system (meaning LED plus phosphor). The color coordinate index (CIE) for a white LED produced by a blue GaN based light emitting diode (LED) providing excitation radiation to a yellow phosphor is controlled mainly by the emission wavelength of the light from the blue LED. Thus, there is a matching process involved with pairing individual LED chips with phosphors. Thus far in the industry, it may be said in general that yellow phosphors having emission wavelengths ranging from about 550 nm to about 575 nm have been selected to match blue LED wavelengths ranging from about 450 nm to about 470 nm, respectively. Such matching has achieved a desired color coordinate index, for example, of CIE (0.300, 0.300). But a large bin/sorting operation is necessary to process today's blue LED chip output into white LED-based lighting systems, largely in part because of the variation in emitting light wavelength from the blue/UV chip.

What is needed in the art is a phosphor composition designed with the ability to correct, or "self-adjust" the chromaticity of the light it emits in response to wavelength/energy variations in the excitation radiation.

SUMMARY OF THE INVENTION

Disclosed herein are "smart" phosphor compositions capable of self-adjusting their chromaticity in response to variations in the excitation wavelengths of the blue/UV LED chips with whom they are partnered. The illumination product formed combining the light emitted by the phosphor composition with the light emitted by the library of blue/UV LED chips has a substantially constant chromaticity. The term "constant chromaticity" in this context means that the x and y CIE chromaticity coordinates of the product illumination each vary by no more than five percent of a reference value.

A "smart" phosphor composition may be defined as a combination of a first phosphor whose emission intensity decreases as the wavelength of the radiation being used to cause its luminescence is increased, with a second phosphor whose emission intensity increases as the excitation wavelength is increased. The advantages of such a phosphor composition include the realization of a lighting scheme that demonstrates substantially constant chromaticity under conditions of varying excitation wavelength. Such a variation in wavelength of the light emitted from different blue LED chips comes about predominantly as a result of manufacturing variations that occurred during production of the blue LED chips. Manufacturing variations can lead to batches of blue LED chips having a range of band gap widths, the consequence to commercial operations being a binning requirement, an exemplary protocol described earlier in this disclosure.

Embodiments of the present invention are directed to a phosphor composition with self-adjusting chromaticity, the composition comprising a first phosphor configured such that its emission intensity increases with increasing excitation wavelength; and a second phosphor configured such that its emission intensity decreases with increasing excitation wavelength. The variation in the chromaticity of the photoluminescence emitted by the phosphor composition is no more than about 5 percent over an about 10 nm range of excitation wavelengths. The 10 nm range of excitation wavelengths may extend from about 450 to about 460 nm.

In one embodiment of the present invention, the first phosphor is a silicate-based orange phosphor having the generalized formula $M_3SiO_5:Eu^{2+}$ where M is Sr, Ba, Mg, or Ca. Specific examples of a silicate-based orange phosphor are $Sr_3Eu_{0.06}Si_{1.02}O_5(F,Cl)_{0.18}$, $Sr_{2.94}Ba_{0.06}Eu_{0.06}Si_{1.02}O_5(F,Cl)_{0.18}$, and $(Sr_{0.9}Ba_{0.1})_{2.76}Eu_{0.06}Si_{1.02}O_5(F,Cl)_{0.18}$.

In this embodiment the second phosphor may be a silicate-based green phosphor having the generalized formula $M_2SiO_4:Eu^{2+}$, where M is Sr, Ba, Mg, or Ca. Specific examples of the second phosphor are $Sr_{0.925}Ba_{1.025}Mg_{0.05}Eu_{0.06}Si_{1.03}O_4(F,Cl)_{0.12}$, $Sr_{1.025}Ba_{0.925}Mg_{0.05}Eu_{0.06}Si_{1.03}O_4(F,Cl)_{0.12}$, and $Sr_{1.125}Ba_{0.825}Mg_{0.05}Eu_{0.06}Si_{1.03}O_4(F,Cl)_{0.12}$.

The use of fluorine (F) and chlorine (Cl) halogen dopants is interchangeable in these compositions, as the choice of halogen has little or no relevance to the self-regulating properties of the phosphor composition.

According to the present embodiments, white LED-based illumination systems comprise a self-adjusting smart phosphor composition matched to a wide array of blue/UV emitting sources; a wider array than would have been possible with conventional phosphor packages. An example of a 5 nm range in excitation is from 452.5 nm to 457.5 nm, where the desired chromaticity of the illumination system may be maintained within the narrow range of x±0.01 and y±0.01. The variation of the product illumination on a CIE diagram would vary from about 0.300±0.01 for the x value, and the 0.300±0.01 for the y value. Presently, at least 5 bins for every 2.5 nm variation in blue/UV excitation wavelength is required to sort those blue LED chips; and after that, another at least 5 bins in 5 different defined CIE regions would be required to satisfy present white LED needs. Current methods require that in each bin brightness and voltage have to be sorted, so at the end the LED packaging company has 168 bins.

In another embodiment a white LED wafer can be manufactured by coating the novel smart phosphor onto a blue/UV LED wafer containing an array (which may be thousands or more) of blue/UV LED chips whose peak emitting wavelength range is larger than 5 nm (again, using the exemplary range 452.5 nm to 457.5 nm). The CIE (x, y) value of an individual white LED chip produced from such a wafer may be controlled to within in a range of x±0.01 and y±0.01), again in the region of the CIE diagram of 0.300±0.01 for x and 0.300±0.01 for y. It is contemplated that the present technologies are applicable to situations where the variation in blue/UV is more than about 5 nm across the wafer, such as the 10 nm variation present in the industry today.

BRIEF DESCRIPTION OF THE DRAWINGS

FIG. 5A is a chart giving the predominant color of emission for a variety of phosphors, and further classifies those phosphors into a group where emission intensity increases with increasing excitation wavelength, and a group where emission intensity decreases with increasing excitation wavelength (and one case where both increasing, neutral, and decreasing behavior was demonstrated);

FIG. 5B is a chart with the same list of phosphors arranged in columns as well as rows, such that phosphor pairs that demonstrate the property of a substantially constant chromaticity even with variations in excitation wavelength, which may also be described as a phosphor pair (or composition) that is able to self-adjust the chromaticity of its emission even as excitation wavelength varies as a result of blue/UV chip fabrication variations;

DETAILED DESCRIPTION OF THE INVENTION

Disclosed herein are "smart" phosphor compositions capable of passively adjusting their own chromaticity (hence the term, "self-adjusting") in response to variations in the excitation wavelengths of the blue/UV LED chips with whom they are partnered. The illumination product formed by combining the light emitted by the phosphor composition with the various light emitted by a library or selection of blue/UV LED chips has a substantially constant chromaticity. The term "constant chromaticity" in this context means that the x and y CIE chromaticity coordinates of the product illumination each vary by no more than five percent of a reference value.

General Operating Principles

Figure 1:
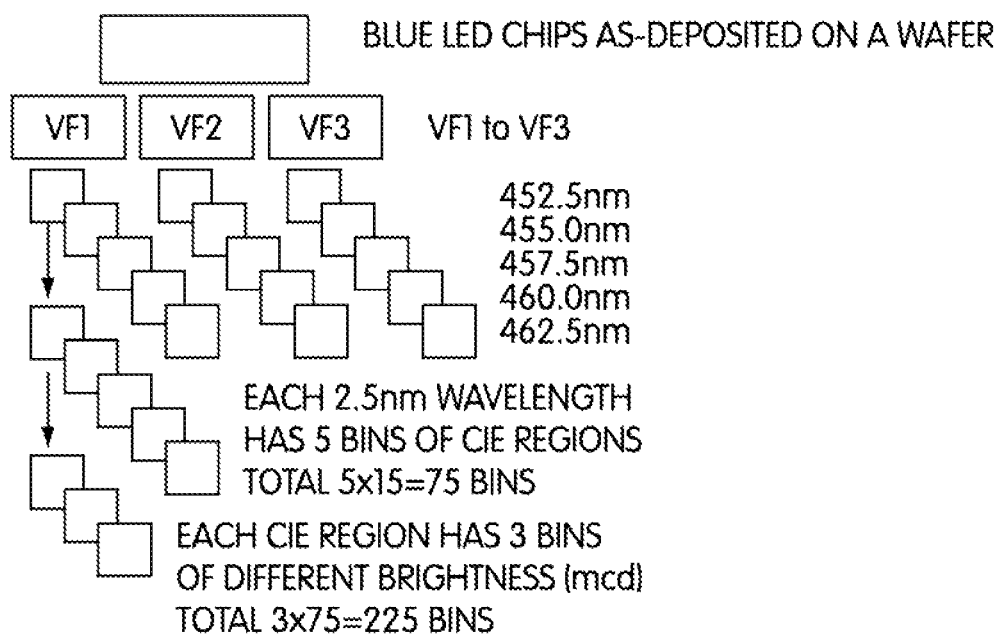
FIG. 1 is a schematic of a sorting process by forward voltage, brightness and excitation wavelength, wherein the blue LED chips diced from the as-deposited wafer are "binned," or categorized into different bins by spectral output, the bins then matched to a phosphor and binned once again, this time by CIE regions of the white light output; each CIE bin is then sorted by brightness, resulting in a total of 225 bins.
Figure 2:
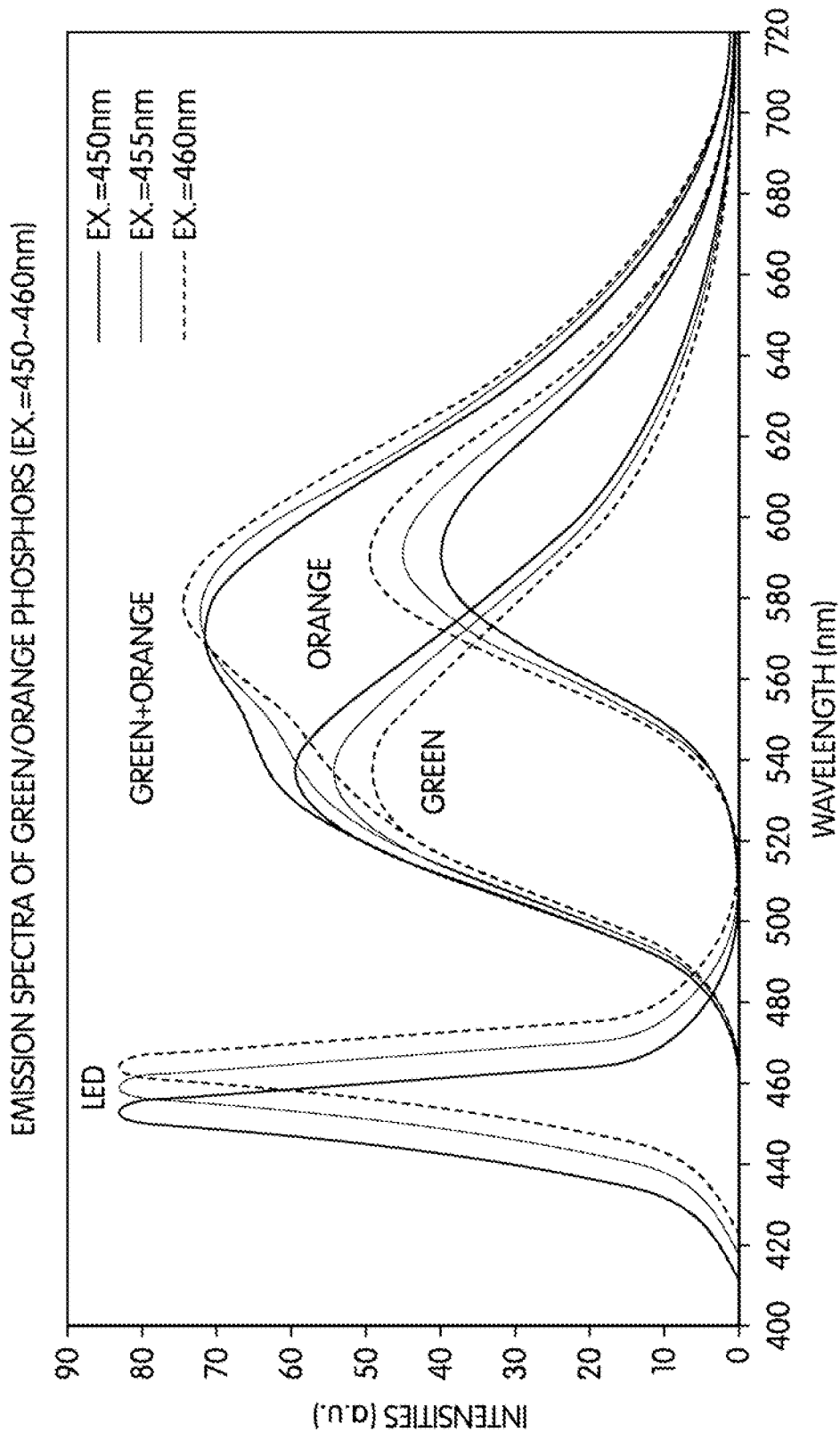
FIG. 2 is an emission spectra of two individual phosphors of an exemplary phosphor composition according to the present embodiments; in the graph is a) the emission of a green-emitting silicate-based phosphor excited by a blue LED excitation at peak emission wavelengths of 450 nm, 455 nm, and 460 nm; b) the emission spectra of an orange emitting, silicate-based phosphor excited by the same three peak emission wavelengths; and c) the emission spectra of a self-adjusting, two-component silicate-based phosphor composition comprising both the green and orange phosphors.
Figure 3:
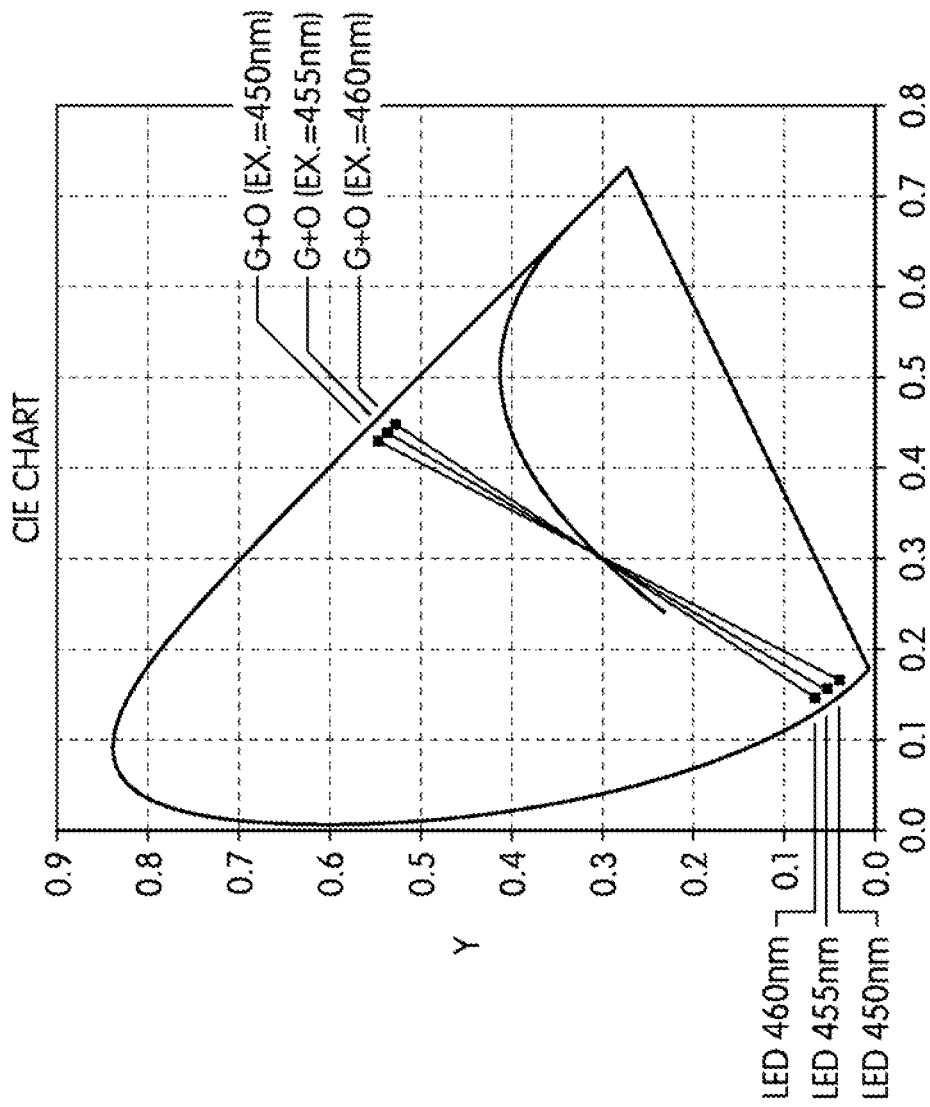
FIG. 3 is a CIE diagram showing the positions of the blue light emitted from three different blue LEDs with peak emission wavelengths at 450, 455, and 460 nm, as well as the three positions of the light emitted from the green/orange "smart phosphor" composition when the smart phosphor composition is excited by that 450, 455, and 460 nm light; the present embodiments are based on the unexpected observation that the three lines formed by connecting the 450 nm data, the 455 nm data, and the 460 nm data each pass through the same CIE target point (in this case having the coordinates x=0.300 and y=0.300)

The principles of operation of a "smart" phosphor composition may be illustrated by inspecting the data in FIGS. 2 and 3. FIG. 2 is an emission spectrum of an exemplary smart phosphor composition; plotted along with its two component phosphors, one labeled "green" and the other "orange." The composition is "green+orange." One will observe that the peak emission wavelength of the composition lies in a somewhat intermediate position to that of the individual green and orange components. It will be understood that the terms "green" and "orange" are used to indicate higher and lower energies relative to yellow, regardless of the phosphors actual colors. On the left side of FIG. 2 are three tall, narrow peaks that represent the three wavelengths at which each of the three samples were excited; these peaks are centered at 450, 455, and 460 nm.

The data in FIG. 2 shows that as the wavelength of the excitation radiation to the green phosphor is increased from 450 to 460 nm, in five nm increments, the intensity of the light emitted by the green phosphor decreases accordingly. Alternatively, as the wavelength of the light used to excite the orange phosphor is increased from 450 to 460 nm, the intensity of the light emitted by the orange phosphor increases accordingly. An unexpected yet favorable consequence is what happens to the resultant combination of the orange and green light: the combined emission not only increases in wavelength with increasing wavelength of the excitation radiation, but the intensity of the combined emitted light increases as well.

While not wishing to be bound by any particular theory, the observed behavior of the individual green and orange phosphors may be explained by the nature of the match between the energy of a photon from the excitation light and the electrical band gap of the phosphor; the "quality" of the match being related to the efficiency at which the phosphor emits light. The light emitted by a green phosphor has a higher energy and a shorter wavelength relative to that emitted by an orange phosphor, indicating that the green phosphor has a larger band gap. Thus, as the peak excitation wavelength is increased the energy of this excitation radiation decreases, becoming less and less optimally matched to the large band gap of the green phosphor (relative to orange), and the intensity of the emission decreases. In contrast, the orange phosphor's band gap is smaller than the green phosphor, such that as the excitation wavelength is increased the energy of the photons decrease, and the excitation becomes better and better matched to the smaller band gap (relative to green) of the orange phosphor. The efficiency at which the orange phosphor emits increases as the wavelength of the blue LED light is increased, indicating that the orange phosphor's lower band gap is more appropriately matched to lower energy excitation.

A "smart" phosphor composition may be defined as a combination of a first phosphor whose emission intensity decreases as the wavelength of the radiation being used to cause its luminescence is increased, with a second phosphor whose emission intensity increases as the excitation wavelength is increased. The advantages of such a phosphor composition include the realization of a lighting scheme that demonstrates substantially constant chromaticity under conditions of varying excitation wavelength. Such a variation in wavelength of the light emitted from different blue LED chips comes about predominantly as a result of manufacturing variations that occurred during production of the blue LED chips. Manufacturing variations can lead to batches of blue LED chips having a range of band gap widths, the consequence to commercial operations being a binning requirement, an exemplary protocol described earlier in this disclosure.

Returning to again to FIG. 2, where these concepts are illustrated with specific data, one may observe an emission spectra of two individual phosphors of an exemplary smart phosphor composition. In the graph is: a) the emission of a green-emitting silicate-based phosphor excited by a blue LED excitation at peak emission wavelengths of 450 nm, 455 nm, and 460 nm; b) the emission spectra of an orange emitting, silicate-based phosphor excited by the same three peak emission wavelengths; and c) the emission spectra of a two-component silicate-based smart phosphor composition comprising the individual green and orange phosphors. Photoluminescence in the two-component composition was induced in the same manner as it had been for the two individual green and orange phosphors; namely, at 450, 455, and 460 nm.

Referring to FIG. 2, the green phosphor was seen to decrease in intensity by at least 10 percent as the excitation wavelength was increased from 450 to 460 nm, where the peak emission wavelength of the green light emission was centered at about 530 to 540 nm. In contrast, the orange phosphor was seen to increase in intensity by at least 10 percent as the excitation wavelength was likewise varied. The composite light demonstrated an increase in the emission intensity by about five percent with an increase in excitation wavelength, centered in the yellow-orange at about 580 nm, even though the green phosphor is more intense than the orange.

Advantages of the present embodiments are perhaps better appreciated when data is viewed graphically on a CIE chromaticity diagram. Shown in FIG. 3, are the chromaticity coordinates plotted for the blue light emitted from three different blue/UV LEDs having different band gap widths, manifested by peak wavelengths of the emitted electroluminescent light at 450, 455, and 460 nm, respectively. Also plotted in FIG. 3 are the x and y CIE coordinates of the light emitted from a smart phosphor excited at 450, 455, and 460 nm.

Referring again to FIG. 3, a first line on the CIE chromaticity diagram connects a point whose x and y coordinates correspond to 450 nm emitted light from a blue/UV LED to a point whose coordinates lie in the yellow region of the diagram. The point in the yellowish region of the diagram is generated by emission of light from a "green/orange" smart phosphor composition upon excitation by the 450 nm light from the blue chip. Similarly, a second line may be drawn connecting a point at one end of the line having the x and y coordinates specific to 455 nm blue light, with a point at the other end of the line representing the emission of the smart phosphor upon excitation by 455 nm radiation. Finally, a third line may be drawn connecting the coordinates of 460 nm blue light from a 460 nm blue LED with the coordinates of light generated by excitation of the smart phosphor with 460 nm light. The present embodiments are based on the unexpected observation that these three lines (the first line connecting the 450 nm data, the second line connecting the 455 nm data, and the third line connecting the 460 nm data) each pass substantially through a common point on the CIE diagram, in this case a desirable target color having x and y coordinates (0.300, 0.300).

Significant advantages of the present embodiments are that a substantially constant chromaticity is realized within a wide range of phosphor compositions, even with undesirable fluctuations in the excitation wavelength. Among the advantages of the present embodiments is that blue/UV LED chips no longer need be "sorted" or "binned" (at least to the extent that they were before) because the smart phosphor composition is able to "self-adjust" the chromaticity of its light output in response to LED variability. In the example of FIG. 3, the chromaticity was substantially constant over a 10 nm change in excitation wavelength. Since one achieves the same chromaticity specification regardless of the excitation wavelength within the 450 to 460 nm range, there would have been no need to do any further sorting of the blue/UV LED chips.

The capability of maintaining the chromaticity at a substantially constant value is important because the locus of chromaticity coordinates that lie along the curved line passing through about (0.3, 0.3) and about (0.45, 0.4) are said to lie along the Black Body Locus (BBL). This is a locus of points defined by Planck's equation:

$$E(\lambda)=A\lambda^{-5}/(e^{(B/T)}-1).$$

Here, E is the emission intensity of the phosphor composition, $\lambda$ is the emission wavelength, T the color temperature of the black body, and A and B are constants. Color coordinates that lie on or near the BBL locus of points yield pleasing white light to a human observer. Thus, as shown in FIG. 3, a composition may be designed whose color coordinates remain positioned substantially overlapping or adjacent to the BBL curve. This trait is particularly desirable in white light illumination applications where the optical performance of the blue/UV chips may vary over considerable ranges.

Figure 4A:
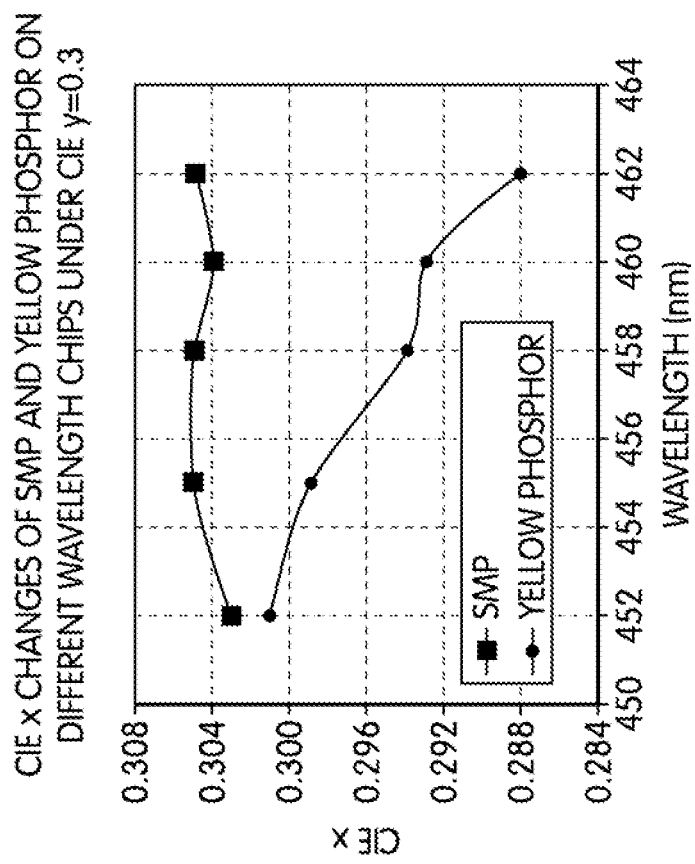
FIGS. 4A and 4B are graphs of CIE chromaticity coordinate (x and y, respectively) plotted against excitation wavelengths that range from 452 to 462, the data showing that CIE coordinates for the exemplary smart phosphor composition (0.8)$Sr_{1.025}Ba_{0.925}Mg_{0.05}Eu_{0.06}Si_{1.03}O_4(F,Cl)_{0.12}$ and (0.2) $Sr_{2.94}Ba_{0.06}Eu_{0.06}Si_{1.02}O_5(F,Cl)_{0.18}$, are substantially constant within this wavelength range, varying by no more than about one percent in either coordinate, whereas the yellow phosphor $Sr_{1.5}Ba_{0.45}Mg_{0.05}Eu_{0.06}Si_{1.03}O_4(F,Cl)_{0.12}$ shows a four percent change in x and eight percent change in y.
Figure 4B:
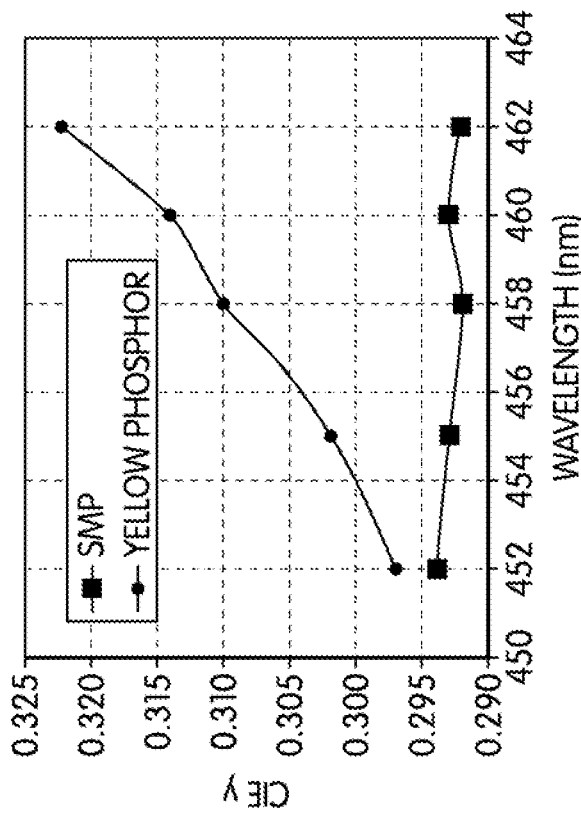

Further demonstration of the ability of the present compositions to self-adjust chromaticity; thereby maintaining chromaticity at substantially constant values even under variations of the excitation wavelength, is shown in FIGS. 4A and 4B. FIG. 4A is a plot of the CIE "x" coordinate versus excitation wavelength (varied from 452 to 462 nm), for two different phosphors labeled "SMP" and "Yellow Phosphor." The yellow phosphor tested had the formula $Sr_{1.5}Ba_{0.45}Mg_{0.05}Eu_{0.06}Si_{1.03}O_4(F,Cl)_{0.12}$. The exemplary smart phosphor (SMP) tested here was a blend of two phosphor components having the formulas (0.8) $Sr_{1.025}Ba_{0.925}Mg_{0.05}Eu_{0.06}Si_{1.03}O_4(F,Cl)_{0.12}$ and (0.2) $Sr_{2.94}Ba_{0.06}Eu_{0.06}Si_{1.02}O_5(F,Cl)_{0.18}$. In these formulations the nomenclature "(F,Cl) is meant to indicate that The fluorine (F) and chlorine (Cl) halogen dopants are interchangeable as far as the property of self-adjusting chromaticity is concerned. In other words, the choice of halogen in these compositions has little or no relevance to the self-regulating properties of the phosphor composition.

Examination of FIGS. 4A and 4B shows that the x chromaticity coordinate values for the yellow phosphor decreased from about 0.301 to 0.288, or about four percent, whereas the y coordinate increased from about 0.297 to 0.323, or about eight percent. In contrast, the x coordinate for the smart phosphor (SMP) varied by less than one percent over the same wavelength range, increasing slightly from about 0.303 to 0.305. Similarly, the smart phosphor's y coordinate decreased only very slightly, from about 0.294 to 0.292 which is again less than one percent.

The Group A and Group B Components of a Smart Phosphor

In general, phosphor compositions having a self-adjusting chromaticity may be generated by blending a phosphor from a so-called group "A," whose members share the common trend that emission intensity decreases with increasing excitation wavelength, with a Group "B" phosphor whose members show the opposite trend: emission intensity increases as the excitation wavelength is increased. An exemplary range of wavelengths is 450 to 460 nm.

The opposing trends used to group a phosphor make sense intuitively. The emission intensity of a phosphor is related to efficiency at which it absorbs its excitation radiation, and this efficiency is in turn related to the matching of the energy between a photon from the excitation radiation, and the band gap width of the phosphor. The light from the UV/blue LED, in this case, provides the excitation radiation to the phosphor, and in one embodiment, the UV/blue LED provides excitation radiation over a wavelength range of 450 to 460 nm.

A division between group A and group B phosphors may generally be made at a band gap energy substantially equivalent to the energy of a photon of yellow light. Thus, group A phosphors may be said to lie on the higher energy side of the yellow phosphors, and include blue, green, and yellow-green phosphors. Group B phosphors may be said to lie on the lower energy side of the yellow phosphors, and include yellow-orange, orange, and red phosphors. In the photoluminescent process, a phosphor is "down-converting" energy absorbed from a photon of excitation radiation to a photon that is emitted from the phosphor, the energy of the emission related to the phosphor's band gap through which an electronic relaxation process occurs, this energy difference being equal to the energy of the emitted photon.

Down-conversion in group A phosphors, with their larger band gaps, is more efficient with higher energy excitation radiation, meaning shorter wavelength light. Thus, emission intensity decreases as the energy of the excitation is reduced (remembering that an increase in excitation wavelength from 450 to 460 nm is a decrease in energy).

In contrast, group B phosphors lie on the orange side of yellow, and emit lower energy (longer wavelength) light relative to group A phosphors, because of their smaller band gap widths. In this case, the down-conversion process occurs more efficiently as the phosphor is excited by lower and lower energies, at least within a designated wavelength range. Thus, the emission intensity of a group B phosphor increases with increasing excitation wavelength.

Principles which may be used to design a self-adjusting phosphor are shown in FIGS. 5A and 5B. FIG. 5A is a table that classifies a selection of exemplary phosphors by the color of the phosphors' emission (as seen by the labels on the tables four left-hand columns: green, yellow, orange, and red). Also shown in the table of FIG. 5A is a characterization as a group A phosphor (emission intensity decreases as excitation wavelength is increased), or as a group B phosphor (emission intensity decreases as excitation wavelength is increased. The exemplary phosphors being classified according to this scheme are listed in the far left column, and include different kinds of phosphors, including commercially available phosphors, phosphors described in the scientific and/or patent literature, and novel phosphors belonging to the present inventors. The four columns under "EM color" (where "EM" stands for emission) labeled green, yellow, orange, and red, refer to the color of the photoluminescence.

The three phosphors at the top of the far left column are labeled "G-series," "Y-series," and "O-series," and refer to phosphor compositions developed by the present inventors, each series emitting substantially in the green, yellow, and orange regions of the spectrum, respectively. YAG is the commonly known material yttrium aluminum garnet, having the formula $Y_3Al_5O_{12}:Ce^{3+}$, and the formula of the terbium aluminum garnet TAG is $Tb_3Al_5O_{12}:Ce^{3+}$. YAG and TAG are commercially available phosphors that emit in the yellow and orange regions of the spectrum, respectively. GP-4 is a green emitting YAG phosphor, also commercially available, having the formula $Y_3(AlGa)_5O_{12}:Ce^{3+}$, and like YAG and TAG, it too is activated by trivalent cerium.

Below those top three phosphors in the far left column are three sulfide-based phosphors, and below those, three phosphors based on silicon nitride and silicon oxynitride. Of the sulfides, two emit in a relatively narrow spectral range, $SrGa_2S_4:Eu$ in the green, and $CaS:Eu$ in the red. The silicon nitride and silicon oxynitrides are also capable of emitting over a relatively large spectral range, with $SrSi_2O_2N_2:Eu$ emitting in the green and yellow, and $(Sr,Ba,Ca)_2Si_5N_8:Eu$ emitting in the yellow, orange, and red, when compositional changes are made in the relative amounts of the alkaline earth components. In at least one case where the alkaline earth component was fixed using a single element, the phosphor emitted in a more narrow range of the spectrum, primarily within a single color range. For example, the silicon nitride based phosphor $Si_2Si_5N_8:Eu$ emitted in the red.

Referring again to FIG. 5A, the three columns on the far right hand side of the table headed by the label "EX Curve (450 to 460 nm)" are further identified by the three conditions: 1) an arrow slanting upwards and to the right, 2) a horizontal line, and 3) an arrow slanting downwards and to the right. These labels refer to whether a particular phosphor show: 1) an increase in emission intensity, 2) no change in intensity, or 3) a decrease in intensity, respectively, as the excitation wavelength is increased within the range 450 to 460 nm. For example, the shaded box in the top row of FIG. 5A under the decreasing arrow means that the G-series phosphor demonstrates a decrease in emission intensity as the excitation wavelength is increased. In contrast, the shaded box in the third row down says that O-series phosphor exhibits an increase in emission intensity as the wavelength of the excitation radiation is increased. It is this behavior that classifies a phosphor into either group A or group B according to the present embodiments.

While the trends demonstrated by the orange and green phosphors of FIG. 5A are somewhat predictable, what is not readily apparent is the behavior of a yellow phosphor. One might expect a yellow phosphor to exhibit a pattern intermediate to that of group A and group B; that is, to show no change in emission intensity with increasing excitation wavelength. This scenario might be expected because of a somewhat lesser sensitivity of a yellow phosphor to variations in excitation energy, since these yellow phosphors have band gap energies that are intermediate in a range defined by all the photoluminescent phosphors that emit in the visible. But this is not the case as the yellow phosphors sometimes fall into the group A category, sometimes into the group B category, and sometimes the behavior appears to be too complex to be categorized.

Examples of the yellow phosphors that may be categorized as group B phosphors are the Y-series developed by the present inventors (although these may more accurately be described as "yellow-green," as described below), and the silicon oxynitride $SrSi_2O_2N_2$:Eu. One example of a phosphor falling into group A is the highly conventional and commercially available, Ce doped phosphor yellow-YAG; another is the silicon nitride compound $(Sr,Ba,Ca)_2Si_5N_8$:Eu. The former observation may suggest that the yellow YAG may more accurately be thought of as a yellow-orange phosphor, whereas the output of the silicon nitride may be adjusted via the ratio of the alkaline earth elements.

A benchmark against which other group A/group B pairs may be judged, particularly in terms of the ability to self-regulate chromaticity, is the composition made by combining a "G-series" phosphor of the type $M_2SiO_4$, with an "O-series" phosphor of the type $M_3SiO_5$, where M is an alkaline earth element in both types of silicates, and where phosphors of the G and O-series were developed by the present inventors. The G-series phosphors may also be used in combination with a Y-series of phosphors, again belonging to the present inventors, where phosphors in the Y-series have the $M_2SiO_4$ configuration. Though the latter are represented in FIG. 5A as emitting in the yellow, previously filed disclosures on these compounds provide experimental data showing them to be more "yellow-green" than yellow, the higher energy green contribution giving them their group B classification. Another example of a smart pair is given by a G or Y-series phosphor with a conventional cerium doped yellow YAG phosphor, remembering that the latter behaves as a group A phosphor and thus may be thought of as "yellow-orange." Yet another smart phosphor is suggested by the combination of a group B (G or Y-series) phosphor with an orange TAG phosphor, and this indeed has proven to be correct.

As alluded to previously, not all combinations of a group A phosphor and a group B successfully produce the constant chromaticity property. An example of a group A phosphor paired with a group B phosphor which combination does not produce any significant "smart activity" are the commercially available green YAG (also denoted as GP-4) and the cerium doped yellow YAG phosphor, shown as an unshaded cell in FIG. 5B in the column headed by "YAG" and the row labeled "GP-4 (Green YAG)."

Group A and B Behavior Contrasted by Excitation Spectra

Figure 6A:
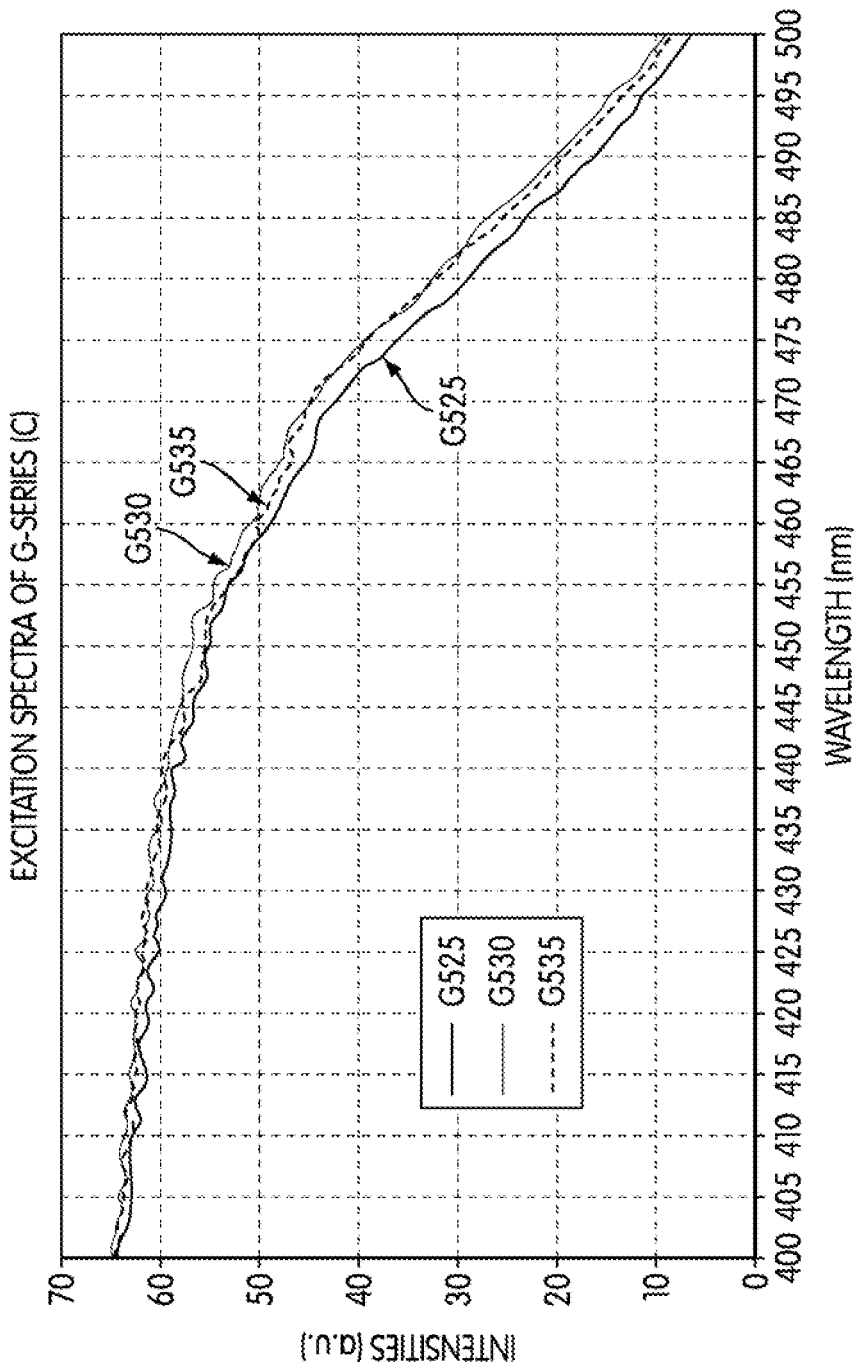
FIGS. 6A and 6B are collections of excitation spectra of three exemplary silicate-based green phosphors of the type $M_2SiO_4:Eu^{2+}$ (FIG. 6A), and three orange phosphors of the form $M_3SiO_5:Eu^{2+}$ (FIG. 6B) over the wavelength ranges 400 to 500 nm (FIG. 6A), and 400 to about 570 nm (FIG. 6B)
Figure 6B:
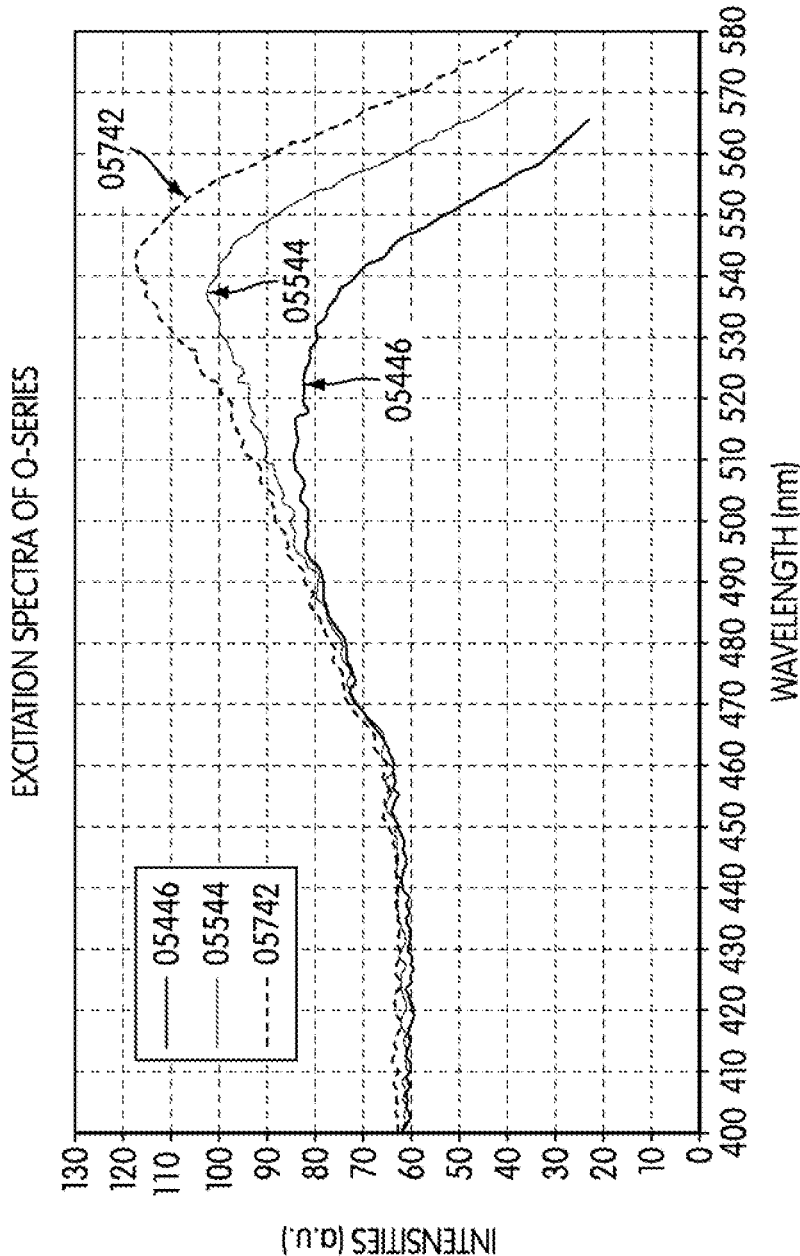

That the group A and group B phosphors of the present invention have contrasting behavior with regard to their excitation spectra is further illustrated in FIGS. 6A, 6B, 7A, and 7B. FIGS. 6A and 6B are excitation spectra measured at between 400 and 500 nm, where the green phosphors G525, G530, and G535 show a decrease in emission intensity with increasing excitation wavelength, particularly from about the wavelengths 450 to 500 nm. In contrast, the emission intensity of the orange series of phosphors O5446, O5544, and O5742 generally increase as the excitation increases from about 450 nm to about 520 to 540 nm. At wavelengths longer than 540 nm, even the orange series of phosphors decrease in emission intensity with increasing excitation wavelength. The compositions of these exemplary oranges phosphors used to produce the excitation curves FIGS. 6A, 6B, 7A, and 7B are: $Sr_3Eu_{0.06}Si_{1.02}O_5(F,Cl)_{0.18}$ for O5446; $Sr_{2.94}Ba_{0.06}Eu_{0.06}Si_{1.02}O_5(F,Cl)_{0.18}$ for O5544, and $(Sr_{0.9}Ba_{0.1})_{2.76}Eu_{0.06}Si_{1.02}O_5(F,Cl)_{0.18}$ for O5742. Again, the nomenclature "(F,Cl)" means that these halogens are interchangeable.

Figure 7A:
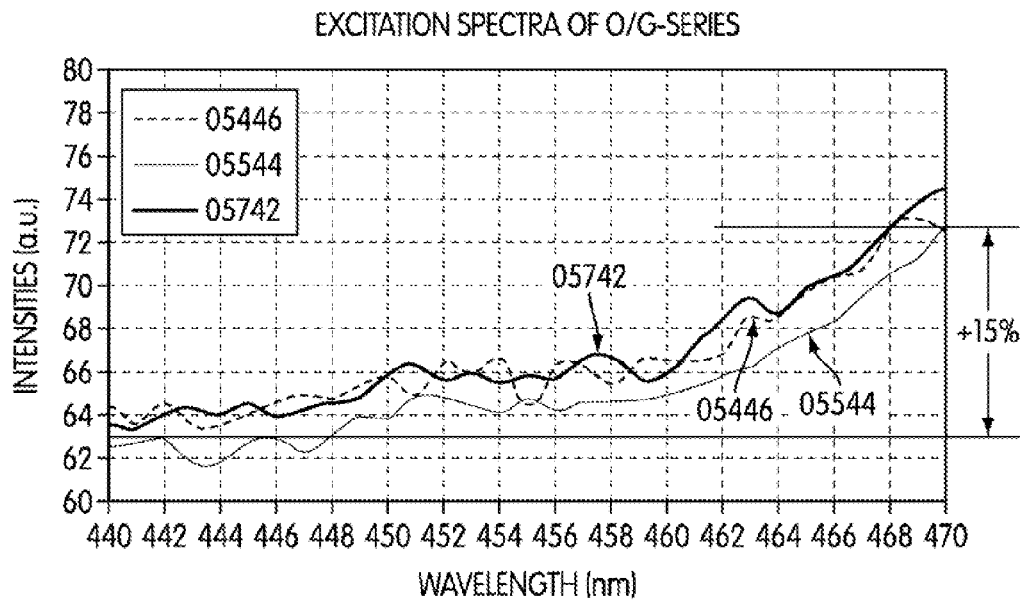
FIGS. 7A and 7B are collections of excitation spectra of the same green and orange phosphors of FIGS. 6A and 6B, but plotted over an excitation wavelength range of 440 to 470 nm to show that an exemplary phosphor from a so-called "group A phosphor" shows an increase of 15 percent in emission intensity, whereas a representative of a "group B phosphor" demonstrates a decrease of 25 percent over the same wavelength range.
Figure 7B:
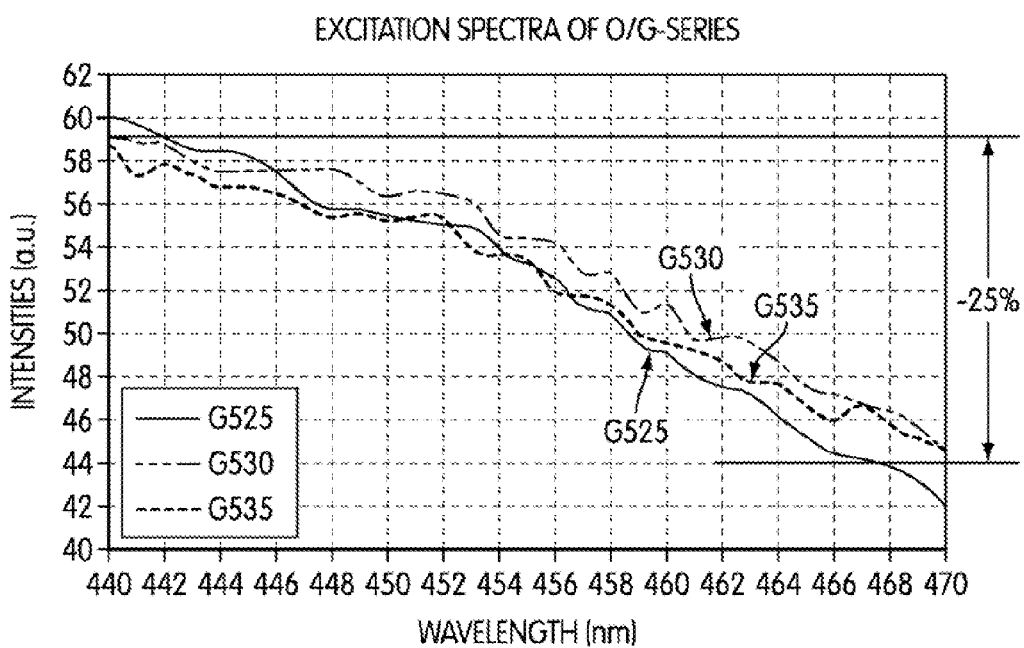

Further quantification of the behavior of group A and group B phosphors is shown in FIGS. 7A and 7B. This set of data shows that the set of orange type phosphors specifically identified by the labels O5742, O5746, and O5544 increases in emission intensity as the excitation wavelength is increased from 440 to 470 nm, within the blue region of the blue/UV excitation source. This represents about an increase in 15 percent in emission intensity. On the other hand, the green type phosphors G530, G535, and G525 decrease in emission intensity by about 25 percent, as illustrated in FIG. 7B.

Figure 8:
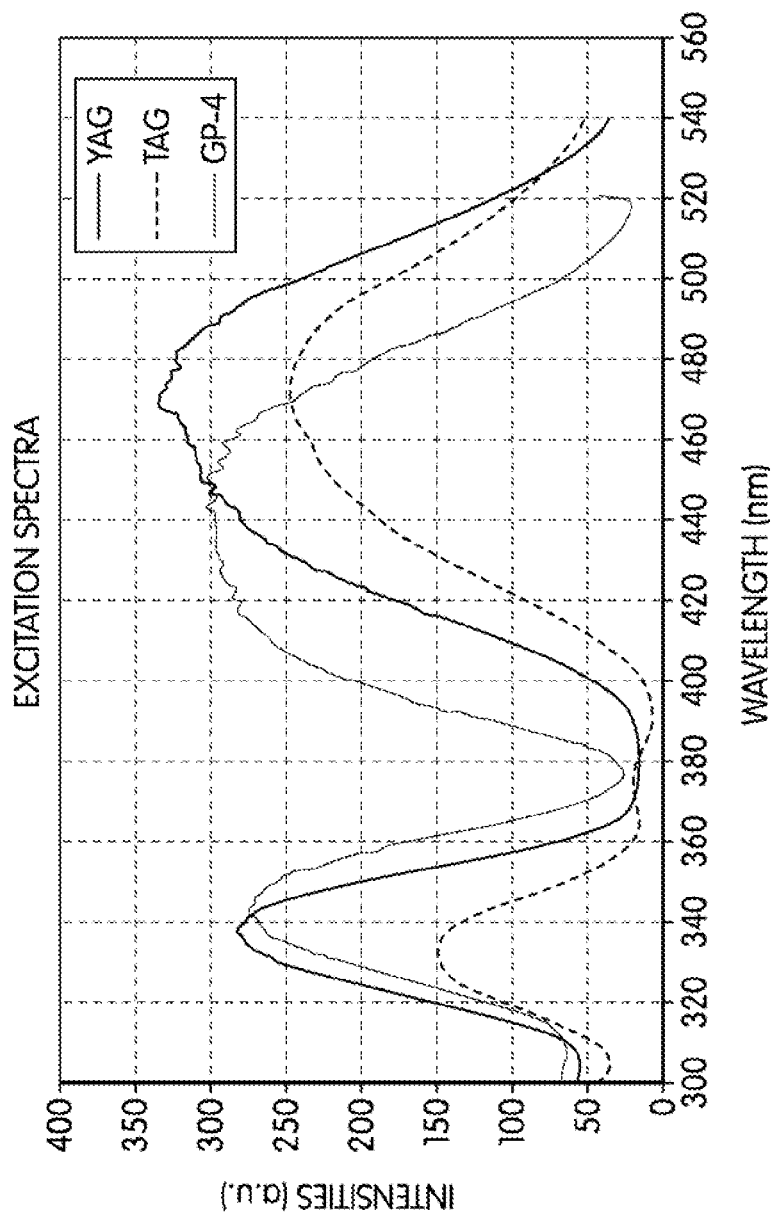
FIG. 8 is an excitation spectrum of the commercially available phosphors GP-4, YAG, and TAG.

Excitation spectra of the commercially available phosphors YAG, TAG, and GP-4 are given in FIG. 8.

Specific Examples of Smart Phosphor Pairs

In addition to the benchmark of smart phosphor performance given by the present inventors' G and O-series phosphors, examples will be provided now utilizing at least one commercially available and/or prior art component phosphors. The results from testing pairs of phosphors are summarized in FIG. 5B, where cell shading indicates that that particular combination of phosphors exhibits at least some degree of self-regulating ability. In one embodiment of the present invention, a smart phosphor comprises a group B, green YAG phosphor with a group A, orange TAG phosphor. The present inventors' group B, Y-series phosphor may also be combined with the group A, orange TAG phosphor.

In another embodiment, a smart phosphor comprises a group B, green $SrGa_2S_4$:Eu phosphor and a group A, O-series phosphor invented and previously disclosed by the present inventors. The green $SrGa_2S_4$:Eu phosphor may also be combined with either a group A, yellow YAG or an orange TAG phosphor.

In another embodiment of the present invention, a smart phosphor is made by combining a group A, red CaS:Eu phosphor with a phosphor from either of the G or Y-series of green and yellow-green, silicate-based phosphors provided by the present inventors. The red CaS:Eu may also be combined with other group B phosphors, such as the GP-4 green YAG and the green $SrGa_2S_4$:Eu phosphors.

Turning now to the silicon oxynitrides, the group B, green (and/or yellow) $SrSi_2O_2N_2$:Eu compound may in one embodiment be combined with any of the group A phosphors selected from the group consisting of the present inventors' O-series, silicate-based phosphors previously disclosed, a yellow (possibly yellow-orange) YAG, an orange TAG, and a red CaS:Eu phosphor.

A number of smart phosphor compositions may be designed around the silicon nitride compound $(Sr,Ba,Ca)_2Si_5N_8$:Eu. The relative content of the alkaline earth elements in this compound may be varied to construct a "family" of phosphors emitting either a green, yellow, orange, or red color, as desired. Accordingly, the green and yellow emitting versions of this phosphor demonstrate group B behavior; the orange and red version group A behavior. Each member of the series may be identified by it emission color: $(Sr,Ba,Ca)_2Si_5N_8$:Eu, yellow $(Sr,Ba,Ca)_2Si_5N_8$:Eu, orange $(Sr,Ba,Ca)_2Si_5N_8$:Eu, red $(Sr,Ba,Ca)_2Si_5N_8$:Eu phosphor, and the like.

In some embodiments of the present invention, a smart phosphor comprises a group B, green and/or yellow $(Sr,Ba,Ca)_2Si_5N_8$:Eu silicon nitride phosphor with a group A, Y-series or O-series, silicate-based phosphor previously disclosed by the present inventors. Alternatively, the green and/or yellow $(Sr,Ba,Ca)_2Si_5N_8$:Eu phosphor may be paired with a group A, yellow YAG or orange TAG phosphor. It may also be paired with the red sulfide CaS:Eu.

Common to phosphor compositions that may be configured to emit over a wide spectral range is the ability to pair a green or yellow version of the phosphor with an orange or red version of the same phosphor, and the silicon nitride family $(Sr,Ba,Ca)_2Si_5N_8$:Eu is advantageously used in this situation as well. In this embodiment, a group B, green or yellow $(Sr,Ba,Ca)_2Si_5N_8$:Eu phosphor is paired with a with a group A, orange or red $(Sr,Ba,Ca)_2Si_5N_8$:Eu phosphor, such that the majority of the composition of this embodiment is $(Sr,Ba,Ca)_2Si_5N_8$:Eu.

Smart phosphors may also be designed around $(Sr,Ba,Ca)_2Si_5N_8$:Eu in its group A configuration, designated by orange $(Sr,Ba,Ca)_2Si_5N_8$:Eu and red $(Sr,Ba,Ca)_2Si_5N_8$:Eu. In one embodiment of the present invention, a smart phosphor is made by combining a group A, red $(Sr,Ba,Ca)_2Si_5N_8$:Eu with a group B phosphor selected from the group consisting of a G-series silicate-based phosphor, a Y-series silicate-based phosphor, and a green $SrSi_2O_2N_2$:Eu phosphor.

G-Series and Y-Series Silicate-Based Phosphor Compositions

More general descriptions of the G-series and Y-series phosphors of the present embodiments will now be given. Phosphors of the G-series comprise silicate-based compounds having the formula $M_2SiO_4$:$Eu^{2+}$, where M is Sr, Ba, Mg, or Ca.

As taught by G. Blasse et al. in Philips Research Reports Vol. 23, No. 1, pp. 1-120, the crystal structure of a β-$Ca_2SiO_4$: Eu, $Sr_2SiO_4$:Eu, or $Ba_2SiO_4$:Eu composition, with $Eu^{2+}$ at a concentration of 2 atomic percent, is $K_2SO_4$-like. Thus, it is contemplated that the present G-series green silicate phosphors have a similar host lattice.

The optical properties of these G-series phosphors may be controlled, among other methods, by adjusting the ratio of the alkaline earth cation to strontium. For example, the wavelength position at which the peak emission occurs changes in a $(Sr_{1-x}Ba_x)_2SiO_4$ phosphor system from a green at 500 nm for x=1 (in other words, when the alkali metal content is 100 percent Ba) to a yellow at 580 nm when x=0 (100 percent Sr). The conversion efficiency from the same light source at 450 nm shows a continuous increase when the Ba increases from 0 to about 90 percent. The peak emission wavelength of 545 nm, obtained when x=0.3, is close to that of a YAG:Ce peak emission wavelength.

There are a variety of ways to include the halogen anion into the inventors' own G-series, green silicate-based phosphors. In one embodiment, a halogen is added to the phosphor composition during a liquid phase step of processing, such as that encountered during the sol-gel or co-precipitation processing methods. This liquid processing allows for mixing on a molecular level, such that the halogen anion is well dispersed within the composition prior to later crystallization steps (e.g., sintering). The present inventors have previously found that the halogen anion influences both emission intensity and peak wavelength. While not wishing to be bound by any particular theory, it is believed that the luminescence of these phosphors Eu doped silicate-based phosphors is due to of the Eu doped phosphors is due an electronic transition from $4f^65d^1$ to $4f^7$ in the $Eu^{2+}$ activator. Emission wavelength depends on the crystal field splitting of the 5d level. With increasing crystal field strength, emission wavelengths increase. The luminescence peak energy of the 5d to 4f transition is affected the most by parameters that affect electron-electron repulsion in the crystal; in other words, the distance between $Eu^{2+}$ cations and its surrounding anions, and the average distance between cations and ions.

Liquid processing enables at least some of the halogen anions to replace the $O^{2-}$ anions of the host silicate, and to become incorporated into the crystal lattice. As the halogen anion is monovalent, then cation vacancies may be created in the crystal lattice in order to maintain electrical charge neutrality. Since vacancies at the cation positions reduce the average distance between cations and anions, the crystal field strength will be increased. Therefore, the peak of the emission curves will move to longer wavelengths as the halogen content increases, and as more cation vacancies are created. The emission wavelength is directly related to the energy gap between the ground and excited states of the electron in question, and this in turn is determined by the crystal field strength.

In the case of the present silicate-based phosphors, the fact that emission wavelength increases as a function of increasing halogen content (within a certain range of halogen content) is strong evidence of halogen incorporation into the host lattice, most likely substitutionally located on oxygen lattice sites. In one embodiment of the present invention, the halogen anion is fluorine or chlorine. Additional evidence of halogen incorporation into the lattice is provided by the data when phosphorus (P) is added to the composition, phosphorus being a cation in at least the case of the G-series phosphors. Addition of phosphorus does not substantially change emission wavelength, and this is evidence, again, that the phosphorus behaves as a cation and therefore does not replace oxygen in the host crystal. Thus, phosphor addition does not appreciably change the host material's crystal field strength in the crystal field surrounding the $Eu^{2+}$ ions, which consist essentially of oxygen sites.

Phosphors of the O-series comprise silicate-based compounds having the generalized formula $M_3SiO_5$:$Eu^{2+}$, where M is an divalent cation such as magnesium (Mg), calcium (Ca), barium (Ba), strontium (Sr), or zinc (Zn). The phosphors may also contain the halogens fluorine (F), chlorine (Cl), and/or bromine (Br).

An exemplary Y-series phosphor configured to emit light having a wavelength ranging from about 460 to 590 nm has the composition $(Sr_{1-x-y}Ba_xCa_yEu_{0.02})_2SiO_{4-z}D_z$, where $0<x\le1.0$, $0<y\le0.8$, and $0<z\le0.2$. An alternative formula for an exemplary Y-series phosphor is $(Sr_{1-x-y}Ba_xMg_y Eu_{0.02})_2SiO_{4-z}D_z$, where $0<x\le1.0$, $0<y\le0.2$, and $0<z\le0.2$. In an alternative embodiment the Y-series phosphor is $(Sr_{1-x-y}Ba_xM_yEu_{0.02})_2SiO_{4-z}D_z$, where $0<x\le1.0$, and M is one or more of Ca, Mg, An, and Cd. In this embodiment, the condition $0<y\le0.5$ applies when M is Ca; $0<y\le1.0$ when M is Mg, and $0<z\le0.5$ when M is either Zn or Cd. In one embodiment, the dopant D is either F, or Cl, or both, and in this embodiment, at least some of the F or Cl replaces oxygen in the host crystal lattice.

O-Series Silicate-Based Phosphor Compositions

Phosphors of the O-series comprise silicate-based compounds having the formula $(Sr,A_1)_x(Si,A_2)(O,A_3)_{2+x}$:$Eu^{2+}$, where $A_1$ is at least one divalent cation (a 2+ ion) including magnesium (Mg), calcium (Ca), barium (Ba), or zinc (Zn), or a combination of 1+ and 3+ cations, $A_2$ is a 3+, 4+, or 5+ cation, including at least one of boron (B), aluminum (Al), gallium (Ga), carbon (C), germanium (Ge), and phosphorus (P); and $A_3$ is a 1–, 2–, or 3– anion, including fluorine (F), chlorine (Cl), bromine (Br); and x is any value between 2.5 and 3.5, inclusive. As with the G-series phosphors, the formula for the Y-series phosphors is written to indicate that the $A_1$ cation replaces silicon (Si), and the $A_3$ anion replaces oxygen (O).

Phosphors of these O-series, silicate-based phosphors may also be described in general by the formula $(Sr_{1-x}M_x)_yEu_z SiO_5$, wherein M is at least one of a divalent alkaline earth metal selected from the group consisting of Ba, Mg, and Ca, but it may include other divalent elements as well, such as Zn. The values of x, y, and z follow the following relationships: $0<x\leq 0.5$, $2.6<y<3.3$, and $0.001<z\leq 0.5$. The phosphor is configured to emit light having a wavelength greater than about 565 nm. In some embodiments, the O-series phosphor has the formula $Sr_3Eu_zSiO_5$. In alternative embodiments the phosphor could be $(Ba_{0.05}Mg_{0.05}Sr_{0.9})_{2.7}Eu_zSiO_5$, or $(Ba_{0.075}Mg_{0.025}Sr_{0.9})_3Eu_zSiO_5$, or $(Ba_{0.05}Mg_{0.05}Sr_{0.9})_3Eu_zSiO_5$. In alternative embodiments the phosphor has the formula $(Mg_xSr_{1-x})_yEu_zSiO_5$, $(Ca_xSr_{1-x})_yEu_zSiO_5$, and $(Ba_xSr_{1-x})_yEu_zSiO_5$, wherein the values of x and y follow the rules $0<x\leq 1$ and $2.6<y<3.3$, and wherein the relationship between y and z is such that y+z is about equal to 3.

As taught by G. Blasse et al. in Philips Research Reports Vol. 23, No. 1, pp. 1-120, the host lattice in a phosphor belonging to the system $MeSiO_5$, where Me is either Ca, Sr, or Ba, has the crystal structure (or is related to the crystal structure) $Cs_3CoCl_5$. Thus, it is contemplated that the present O-series, orange silicate-based phosphors have a similar host lattice.

To describe the desired amount of activator content, the O-series phosphors may be represented in general by the formula $(Sr_{1-x}M_x)_yEu_zSiO_5$, where the level of the europium activator is described by the "z" parameter, which may range from about $0.001<z<0.5$. The effects of including a halogen into the O-series phosphors may be described by embodiments having the formula $(M_{1-x}Eu_x)_ySiO_5H_{6z}$. In this embodiment, H is a halogen anion selected from the group consisting of F, Cl, and Br, and the amount of the halogen included in the composition is described again by the parameter "z." Here, z ranges from $0<z<0.1$.

Self-Adjusting Smart Phosphor for Constant Chromaticity and its Implications for Binning of a White Illumination System According to the present embodiments, white LED-based illumination systems comprise a self-adjusting smart phosphor composition matched to a wide array of blue/UV emitting sources; a wider array than would have been possible with conventional phosphor packages. An example of a 5 nm range in excitation is from 452.5 nm to 457.5 nm, where the desired chromaticity of the illumination system may be maintained within the narrow range of x±0.01 and y±0.01. The variation of the product illumination on a CIE diagram would vary from about 0.300±0.01 for the x value, and the 0.300±0.01 for the y value. Presently, at least 5 bins for every 2.5 nm variation in blue/UV excitation wavelength is required to sort those blue LED chips; and after that, another at least 5 bins in 5 different defined CIE regions would be required to satisfy present white LED needs. Current methods require that in each bin brightness and voltage have to be sorted, so at the end the LED packaging company has 168 bins.

In another embodiment a white LED wafer can be manufactured by coating the novel smart phosphor onto a blue/UV LED wafer containing an array (which may be thousands or more) of blue/UV LED chips whose peak emitting wavelength range is larger than 5 nm (again, using the exemplary range 452.5 nm to 457.5 nm). The CIE (x, y) value of an individual white LED chip produced from such a wafer may be controlled to within in a range of x±0.01 and y±0.01), again in the region of the CIE diagram of 0.300±0.01 for x and 0.300±0.01 for y. It is contemplated that the present technologies are applicable to situations where the variation in blue/UV is more than about 5 nm across the wafer, such as the 10 nm variation present in the industry today.

What is claimed is:

1. A process to produce an illumination system comprising: providing a plurality of blue LEDs wherein said plurality of blue LEDs have peak emission intensities at wavelengths over a range of greater than or equal to 5 nm; and coating said plurality of blue LEDs with a phosphor composition comprising two phosphor materials, such that each of the CIE(x,y) color coordinates of each of the coated blue LEDs are within a range of x of ±0.01 and a range of y of ±0.01.

2. The process of claim 1, wherein a first phosphor material of said phosphor composition is configured to emit yellow light with a peak emission intensity wavelength that increases with increasing excitation wavelength, and a second phosphor material of said phosphor composition is configured to emit yellow light with a peak emission intensity wavelength that decreases with increasing excitation wavelength.

3. The process of claim 1, wherein a first phosphor material of said phosphor composition has a shorter peak emission intensity wavelength than a second phosphor material of said phosphor composition; wherein the peak emission intensity of said first phosphor material decreases as the excitation wavelength is increased; and wherein the peak emission intensity of said second phosphor material increases as the excitation wavelength is increased.

4. The process of claim 1, wherein a first phosphor material of said phosphor composition has a shorter peak emission intensity wavelength than a second phosphor material of said phosphor composition; wherein the peak emission intensity of said first phosphor material decreases as the excitation wavelength is increased; and wherein the peak emission intensity of said second phosphor material is substantially unchanged as the excitation wavelength is increased.

5. The process of claim 1, wherein a first phosphor material of said phosphor composition has a shorter peak emission wavelength than a second phosphor material of said phosphor composition; wherein the peak emission intensity of said first phosphor material is substantially unchanged as the excitation wavelength is increased; and wherein the peak emission intensity of said second phosphor material increases as the excitation wavelength is increased.

6. The process of claim 1, wherein said range of peak emission intensity wavelengths of said plurality of blue LEDs lies between 440 nm and 480 nm.

7. The process of claim 1, wherein the peak emission intensity wavelengths of the light emitted from said phosphor composition range from 545 nm to 580 nm.

8. The process of claim 1, wherein said plurality of blue LEDs are on a wafer.

9. The process of claim 1, wherein said plurality of blue LEDs have peak emission intensities at wavelengths over a range of about 10 nm.

10. The process of claim 1, wherein said phosphor composition includes a first phosphor material that is a silicate-based orange phosphor selected from the group consisting of $Sr_3Eu_{0.06}Si_{1.02}O_5(F,Cl)_{0.18}$, $Sr_{2.94}Ba_{0.06}Eu_{0.06}Si_{1.02}O_5(F,Cl)_{0.18}$, and $(Sr_{0.9}Ba_{0.1})_{2.76}Eu_{0.06}Si_{1.02}O_5(F,Cl)_{0.18}$.

11. The process of claim 1, wherein said phosphor composition includes a second phosphor material that is a silicate-based green phosphor selected from the group consisting of $Sr_{0.925}Ba_{1.025}Mg_{0.05}Eu_{0.06}Si_{1.03}O_4(F,Cl)_{0.12}$, $Sr_{1.025}Ba_{0.925}Mg_{0.05}Eu_{0.06}Si_{1.03}O_4(F,Cl)_{0.12}$, and $Sr_{1.125}Ba_{0.825}Mg_{0.05}Eu_{0.06}Si_{1.03}O_4(F,Cl)_{0.12}$.

12. The process of claim 1, wherein said plurality of blue LEDs have peak emission intensities at wavelengths over a range of greater than 5 nm.

13. A process to produce an illumination system comprising:
- providing a plurality of blue LEDs wherein said plurality of blue LEDs have peak emission intensities at wavelengths over a range of 10 nm; and
- coating said plurality of blue LEDs with a phosphor composition comprising two phosphor materials such that the x values of the CIE(x,y) color coordinates of each of the coated LEDs are within a range of 5% and the y values of the CIE(x,y) color coordinates of each of the coated LEDs are within a range of 5%.

14. The process of claim 13, wherein a first phosphor material of said phosphor composition is configured to emit yellow light with a peak emission intensity wavelength that increases with increasing excitation wavelength, and a second phosphor material of said phosphor composition is configured to emit yellow light with a peak emission intensity wavelength that decreases with increasing excitation wavelength.

15. The process of claim 13, wherein a first phosphor material of said phosphor composition has a shorter emission wavelength than a second phosphor material of said phosphor composition; wherein the peak emission intensity of said first phosphor material decreases as the excitation wavelength is increased; and wherein the peak emission intensity of said second phosphor material increases as the excitation wavelength is increased.

* * * * *